United States Patent
Li et al.

(10) Patent No.: US 11,750,219 B2
(45) Date of Patent: Sep. 5, 2023

(54) DECODING METHOD, DECODER, AND DECODING APPARATUS

(71) Applicant: HUAWEI TECHNOLOGIES CO., LTD., Guangdong (CN)

(72) Inventors: Mo Li, Chengdu (CN); Dori Gidron, Hod Hasharon (IL); Michael Zarubinsky, Hod Hasharon (IL); Dudi Levy, Hod Hasharon (IL)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/852,218

(22) Filed: Jun. 28, 2022

(65) Prior Publication Data
US 2022/0329260 A1 Oct. 13, 2022

Related U.S. Application Data

(63) Continuation of application No. PCT/CN2020/117022, filed on Sep. 23, 2020.

(30) Foreign Application Priority Data

Dec. 30, 2019 (CN) .......................... 201911393850.1

(51) Int. Cl.
*H03M 13/00* (2006.01)
*H03M 13/11* (2006.01)
*H04L 25/06* (2006.01)

(52) U.S. Cl.
CPC .... *H03M 13/1128* (2013.01); *H03M 13/1108* (2013.01); *H03M 13/1111* (2013.01); *H04L 25/067* (2013.01)

(58) Field of Classification Search
CPC ......... H03M 13/1128; H03M 13/1105; H03M 13/2948; H03M 13/1108; H03M 13/1111; H03M 13/2927; H04L 25/067
See application file for complete search history.

(56) References Cited

U.S. PATENT DOCUMENTS

| | | | |
|---|---|---|---|
| 6,460,160 B1 | 10/2002 | Classon | |
| 8,341,502 B2 * | 12/2012 | Steiner | G06F 11/1012 714/755 |

(Continued)

FOREIGN PATENT DOCUMENTS

| | | |
|---|---|---|
| CN | 103503319 A | 1/2014 |
| CN | 103684680 A | 3/2014 |

(Continued)

OTHER PUBLICATIONS

Hager et al, "Approaching Miscorrection-Free Performance of Product Codes With Anchor Decoding," IEEE Transactions on Communications, vol. 66, No. 7, Jul. 2018, 12 pages.

(Continued)

*Primary Examiner* — Esaw T Abraham
(74) *Attorney, Agent, or Firm* — Fish & Richardson P.C.

(57) ABSTRACT

This application discloses example decoding methods, example decoders, and example decoding apparatuses. One example decoding method includes performing soft decision decoding on a first sub-codeword in a plurality of sub-codewords to obtain a hard decision result. It is determined whether to skip a decoding iteration. In response to determining not to skip the decoding iteration, a first turn-off identifier corresponding to the first sub-codeword is set to a first value based on the hard decision result. The first turn-off identifier indicates whether to perform soft decision decoding on the first sub-codeword in a next decoding iteration. The soft decision decoding is not performed on the first sub-codeword in the next decoding iteration when a value indicated by the first turn-off identifier is the first value. The hard decision result is stored.

20 Claims, 12 Drawing Sheets

(56) References Cited

U.S. PATENT DOCUMENTS

| | | | |
|---|---|---|---|
| 9,755,665 B1* | 9/2017 | Chilappagari | H03M 13/1105 |
| 10,164,656 B2* | 12/2018 | Yang | H03M 13/45 |
| 10,187,086 B2* | 1/2019 | Bhatia | H03M 13/2909 |
| 10,419,024 B2* | 9/2019 | Xiong | H04L 1/0057 |
| 10,511,326 B2* | 12/2019 | Chang | H03M 13/1108 |
| 2006/0045214 A1 | 3/2006 | Shiina | |
| 2008/0052594 A1 | 2/2008 | Yedidia et al. | |
| 2016/0112068 A1 | 4/2016 | Kim | |
| 2016/0283321 A1* | 9/2016 | Yang | H03M 13/3746 |
| 2018/0278273 A1 | 9/2018 | Kifune et al. | |

FOREIGN PATENT DOCUMENTS

| | | |
|---|---|---|
| CN | 104092470 A | 10/2014 |
| CN | 104579369 A | 4/2015 |
| CN | 106341136 A | 1/2017 |
| CN | 108347297 A | 7/2018 |
| CN | 106537787 B | 10/2019 |
| EP | 3171520 A1 | 5/2017 |
| KR | 20040086872 A | 10/2004 |
| WO | 2016015288 A1 | 2/2016 |

OTHER PUBLICATIONS

Ahn et al., "Low Complexity Syndrome-Based Decoding Algorithm Applied to Block Turbo Codes," IEEE Access, vol. 6, Jun. 5, 2018, 14 pages.

Dou et al, "Soft-Decision Based Sliding-Window Decoding of Staircase Codes," 2018 IEEE 10th International Symposium on Turbo Codes and Iterative Information Processing, Dec. 3-7, 2018, 5 pages.

Chen et al, "An Efficient Stopping Criterion for Turbo Product Codes," IEEE Communications Letters, vol. 11, No. 6, Jun. 2007, 3 pages.

Office Action in Chinese Appln. No. 201911393850.1, dated Sep. 5, 2022, 12 pages (with English translation).

Extended European Search Report in European Appln No. 20908654.5, dated Aug. 12, 2022, 14 pages.

International Search Report and Written Opinion in International Appln No. PCT/CN2020/117022, dated Dec. 21, 2020, 15 pages (with English translation).

* cited by examiner

|     | 1 | 2 | 3 | 4 | 5 | 6 | 7 | 8 | 9 | 10 | ... |
|-----|---|---|---|---|---|---|---|---|---|----|-----|
| BS 1 | 0 | 0 | 0 | 0 | 0 | 0 | 0 | 0 | 0 | 0 | ... |
| BS 2 | 0 | 0 | 0 | 0 | 0 | 0 | 1 | 0 | 0 | 0 | ... |
| BS 3 | 0 | 0 | 1 | 0 | 0 | 0 | 0 | 0 | 0 | 0 | ... |
| BS 4 | 0 | 0 | 1 | 0 | 0 | 0 | 1 | 0 | 0 | 0 | ... |

FIG. 4

|     | 1 | 2 | 3 | 4 | 5 | 6 | 7 | 8 | 9 | 10 | ... |
|-----|---|---|---|---|---|---|---|---|---|----|-----|
| D0  | 1 | 0 | 0 | 1 | 1 | 0 | 1 | 0 | 0 | 1  | ... |
| BS 1 | 0 | 0 | 0 | 0 | 0 | 0 | 0 | 0 | 0 | 0 | ... |
| TS 1 | 1 | 0 | 0 | 1 | 1 | 0 | 1 | 0 | 0 | 1 | ... |
| BS 2 | 0 | 0 | 0 | 0 | 0 | 0 | 1 | 0 | 0 | 0 | ... |
| TS 2 | 1 | 0 | 0 | 1 | 1 | 0 | 0 | 0 | 0 | 1 | ... |
| BS 3 | 0 | 0 | 1 | 0 | 0 | 0 | 0 | 0 | 0 | 0 | ... |
| TS 3 | 1 | 0 | 1 | 1 | 1 | 0 | 1 | 0 | 0 | 1 | ... |
| BS 4 | 0 | 0 | 1 | 0 | 0 | 0 | 1 | 0 | 0 | 0 | ... |
| TS 4 | 1 | 0 | 1 | 1 | 1 | 0 | 0 | 0 | 0 | 1 | ... |

FIG. 5

DECODING METHOD, DECODER, AND DECODING APPARATUS

CROSS-REFERENCE TO RELATED APPLICATIONS

This application is a continuation of International Patent Application No. PCT/CN2020/117022, filed on Sep. 23, 2020, which claims priority to Chinese Patent Application No. 201911393850.1, filed on Dec. 30, 2019. The disclosures of the aforementioned applications are hereby incorporated by reference in their entireties.

TECHNICAL FIELD

This application relates to the communications field, and in particular, to a decoding method, a decoder, and a decoding apparatus.

BACKGROUND

In a high-speed optical transmission system, a forward error correction (FEC) technology is needed to improve transmission performance of the system, to support a greater transmission distance. Herein, FEC indicates coding to-be-transmitted data according to a specific rule, and introducing a specific redundancy (that is, overheads) at a transmit end; and performing decoding at a receive end according to a corresponding coding rule, to correct a data transmission error introduced to a transmission process due to noise or channel damage. FEC may be classified into hard-decision FEC and soft-decision FEC according to a decoding manner.

The hard-decision FEC indicates that a value of each bit of data input to an FEC decoder can only be 0 or 1. The input data is referred to as hard information. The decoder calculates and updates only the hard information in a decoding process, and finally outputs hard information. The soft-decision FEC indicates that data of each bit input to an FEC decoder is represented by a floating-point value or fixed-point values obtained through quantization. A symbol of the value indicates a value of the bit: 0 or 1. An absolute value indicates confidence of the value. The input data is referred to as soft information. The decoder calculates and updates the soft information in a decoding process, and finally outputs hard information.

The hard-decision FEC has low implementation complexity and requires low power consumption, but brings a smaller enhancement in performance of a transmission system than the soft-decision FEC does. The soft-decision FEC brings a greater enhancement in the performance of the transmission system than the hard-decision FEC does, but has high implementation complexity and high power consumption. Therefore, different decoding manners need to be selected according to different application scenarios. For this reason, in a current FEC chip design, it is expected that decoding in a plurality of application scenarios can be supported in one FEC chip, and requirements on power consumption, a delay, and the like of a system can be met.

In a conventional technology, soft decision decoding is directly used. Decoding is terminated when a decoding result meets a specific condition. However, generally, a relatively small quantity of bit errors remain in several times of soft decision decoding before the decoding is terminated. In the soft decision decoding, most performance of a decoder is wasted, causing large unnecessary power consumption.

SUMMARY

In view of this, embodiments of this application provide a decoding method, a decoder, and a decoding apparatus, to reduce decoding power consumption.

According to a first aspect, an embodiment of this application discloses a decoding method. The decoding method includes:

performing soft decision decoding on a first-row sub-codeword in a plurality of sub-codewords of a codeword to obtain a first hard decision result; and determining whether to skip a decoding iteration; and when the decoding iteration is not skipped, setting, to a first value based on the first hard decision result, a first turn-off identifier corresponding to the first-row sub-codeword, where the first turn-off identifier is used to indicate whether to perform soft decision decoding on the first-row sub-codeword in a next decoding iteration, and the soft decision decoding is not performed on the first-row sub-codeword in the next decoding iteration when a value indicated by the first turn-off identifier is the first value; and storing the first heard decision result; or when the decoding iteration is skipped, outputting the first hard decision result.

Herein, the first hard decision result is a valid hard decision result of the first-row sub-codeword, that is, a valid sub-codeword. In the decoding method disclosed in this application, a turn-off identifier is added for each to-be-decoded sub-codeword. If a valid hard decision result has been generated for a first sub-codeword, a value indicated by a turn-off identifier of the sub-codeword is updated to the first value, to indicate that the soft decision decoding does not need to be performed on the first sub-codeword in a next decoding iteration, thereby reducing decoding power consumption and improving decoding efficiency.

In a possible design, a value of at least one first bit in the first hard decision result is different from a value of the first bit in a hard decision result stored before the soft decision decoding is performed on the first-row sub-codeword at a current time. The first bit corresponds to a first-column sub-codeword. The first-column sub-codeword and the first-row sub-codeword intersect at the first bit. A turn-off identifier corresponding to the first-column sub-codeword is set to a second value. When a value indicated by the turn-off identifier corresponding to the first-column sub-codeword is the second value, soft decision decoding is performed on the first-column sub-codeword in a next decoding iteration.

The hard decision result stored before the soft decision decoding is performed on the first-row sub-codeword at a current time is generally a hard decision result obtained in a decoding iteration performed on the first-row sub-codeword at a previous time. When a bit error exists in the first-row sub-codeword, not only soft decision decoding is performed on the first-row sub-codeword again, but also decoding is performed on the first-column sub-codeword associated with the first-row sub-codeword, thereby improving decoding accuracy and precision.

In a possible design, a second turn-off identifier corresponding to a second sub-codeword in the plurality of sub-codewords of the codeword is obtained. A value indicated by the second turn-off identifier is the first value. A second hard decision result of the second sub-codeword is obtained. The second hard decision result is a valid hard decision result obtained in a decoding iteration before a current decoding iteration. It is determined whether to skip a decoding iteration. When the decoding iteration is not skipped, second soft information is generated based on the second hard decision result. The second soft information is used for soft decision decoding in a next decoding iteration performed on the second sub-codeword. When the decoding iteration is skipped, the second hard decision result is output.

When the second sub-codeword is decoded at a current time, the second turn-off identifier corresponding to the second sub-codeword has been stored. The value indicated by the second turn-off identifier is the second value. Therefore, the second sub-codeword does not need to be decoded at a current time.

In a possible design, the generating second soft information based on the second hard decision result includes: generating the second soft information based on a symbol value corresponding to the second hard decision result and a bit width value of the second soft information. A maximum bit width value or a relatively large width value of soft information is optimally selected.

In a possible design, a third turn-off identifier corresponding to a third sub-codeword in the plurality of sub-codewords is obtained. A value indicated by the third turn-off identifier is the second value. The third sub-codeword needs to be decoded in a current decoding iteration. Third soft information corresponding to the third sub-codeword is obtained. Soft decision decoding is performed on the third sub-codeword based on the third soft information to obtain a third hard decision result.

It is determined whether the third hard decision result is valid. If the third hard decision result is valid, new third soft information is generated. The new third soft information is used for a subsequent decoding iteration performed on the third sub-codeword. The value indicated by the third turn-off identifier is updated to the first value. Because the third hard decision result is valid, the third sub-codeword does not need to be decoded in a next decoding iteration.

In a possible design, after the performing soft decision decoding on the third sub-codeword based on the third soft information to obtain a third hard decision result, the method further includes:

determining that a current decoding iteration is a final decoding iteration in a preset quantity of decoding iterations;

skipping the decoding iteration; and outputting the third hard decision result.

In a possible design, the determining whether the third hard decision result is valid includes:

calculating, based on the third hard decision result obtained for the third sub-codeword, a syndrome matrix corresponding to the third sub-codeword; and determining, based on a value of the syndrome matrix corresponding to the third sub-codeword, whether the third hard decision result is valid.

According to a second aspect, an embodiment of this application discloses a decoder. The decoder includes a processor, a first memory, and a second memory.

The processor is configured to perform soft decision decoding on a first-row sub-codeword in a plurality of sub-codewords of a codeword to obtain a first hard decision result.

The first memory is configured to store a first turn-off identifier corresponding to the first-row sub-codeword.

The second memory is configured to store the first hard decision result.

The processor is further configured to set the first turn-off identifier to a first value. The first turn-off identifier is used to indicate whether to perform soft decision decoding on the first-row sub-codeword in a next decoding iteration. The soft decision decoding is not performed on the first-row sub-codeword in the next decoding iteration w % ben a value indicated by the first turn-off identifier is the first value.

The processor is further configured to store the first hard decision result in the second memory.

In a possible design, the decoder further includes an output interface. The output interface is configured to output the first hard decision result obtained through decoding the first-row sub-codeword.

In a possible design, the processor is further configured to: determine that a value of at least one first bit in the first hard decision result is different from a value of the first bit in a hard decision result stored before the soft decision decoding is performed on the first-row sub-codeword at a current time. The first bit corresponds to a first-column sub-codeword. The first-column sub-codeword and the first-row sub-codeword intersect at the first bit.

The processor is further configured to: set, to a second value, a turn-off identifier corresponding to the first-column sub-codeword; and when a value indicated by the turn-off identifier corresponding to the first-column sub-codeword is the second value, perform soft decision decoding on the first-column sub-codeword in a next decoding iteration.

In a possible design, the decoder further includes an input interface. The input interface is configured to obtain a second turn-off identifier corresponding to a second sub-codeword in the plurality of sub-codewords. A value indicated by the second turn-off identifier is the first value.

The input interface is further configured to obtain a second hard decision result of the second sub-codeword.

The processor is configured to determine whether to skip a decoding iteration. When the decoding iteration is not skipped, the processor generates second soft information based on the second hard decision result. The second soft information is used for soft decision decoding in a next decoding iteration performed on the second sub-codeword.

When the decoding iteration is skipped, the output interface is further configured to output the second hard decision result obtained through decoding the second sub-codeword.

In a possible design, the input interface is further configured to obtain a third turn-off identifier corresponding to a third sub-codeword in the plurality of sub-codewords. A value indicated by the third turn-off identifier is the second value. The input interface is further configured to obtain third soft information corresponding to the third sub-codeword. The processor is further configured to perform soft decision decoding on the third sub-codeword based on the third soft information to obtain a third hard decision result.

When the processor determines that the third hard decision result is valid, the processor is further configured to generate new third soft information. The new third soft information is used for a subsequent decoding iteration performed on the third sub-codeword. The processor is further configured to update the value indicated by the third turn-off identifier to the first value.

In a possible design, after the processor performs soft decision decoding on the third sub-codeword based on the third soft information to obtain the third hard decision result, the processor is further configured to skip the decoding iteration. The output interface is further configured to output the third hard decision result.

In a possible design, that the processor determines whether to skip the decoding iteration includes:

The processor determines whether a current quantity of iterations reaches a preset quantity of iterations.

The processor skips the decoding iteration when the current quantity of iterations reaches the preset quantity of iterations; or does not skip the decoding iteration when the current quantity of iterations does not reach the preset quantity of iterations.

According to a third aspect, an embodiment of this application discloses a decoding apparatus. The decoding apparatus includes a memory and a processor.

The memory is configured to store a program.

The processor is configured to execute the program stored in the memory. When the program is executed, the processor is configured to perform the method in any one of the possible implementations of the first aspect.

In a possible design, the decoding apparatus is a chip or an integrated circuit.

According to a fourth aspect, an embodiment of this application discloses a computer storage medium. The computer storage medium stores computer-readable instructions. When a computer reads and executes the computer-readable instructions, the computer is enabled to perform the method in any one of the possible implementations of the first aspect.

According to a fifth aspect, an embodiment of this application further discloses a computer program product. When a computer reads and executes the computer program product, the computer is enabled to perform the method in any one of the possible implementations of the first aspect.

BRIEF DESCRIPTION OF DRAWINGS

FIG. 4 is a schematic diagram of a method of obtaining a basic sequence according to an embodiment of this application;

FIG. 5 is a schematic diagram of a method of obtaining a test sequence according to an embodiment of this application;

DESCRIPTION OF EMBODIMENTS

This application discloses a decoding method, a decoder, and a decoding apparatus, to reduce decoding power consumption. The following provides descriptions in detail.

The decoding method, the decoder, and the decoding apparatus disclosed in this application may be applied to a type of linear code defined by using a check matrix, for example, a low density parity check code (LDPC), and also applied to a two-dimensional codeword, for example, a TPC (Turbo Product Codes) codeword. The decoding method disclosed in this application may be further applied to another type of two-dimensional codeword or multi-dimensional codeword. This is not limited in this application.

Figure 1A:
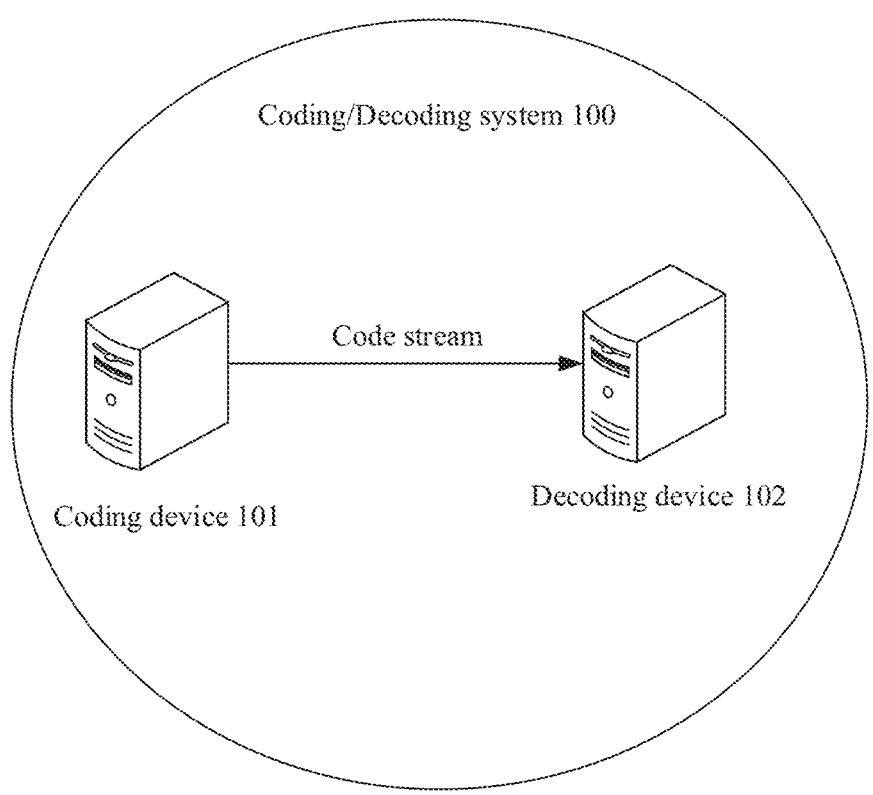
FIG. 1a is a schematic diagram of a structure of a coding/decoding system according to an embodiment of this application.

FIG. 1a is a schematic diagram of a coding system according to an embodiment of this application. With reference to FIG. 1a, the coding system 100 may include a coding device 101 and a decoding device 102. The coding device 101 is configured to: code each data block in a data flow to obtain a codeword corresponding to each data block, and send a code stream composed of the codewords to the decoding device 102. The data flow may be any one of a video stream, an audio stream, a text stream, or the like. One codeword is a result of coding one data block by the coding device 101. Each codeword may be considered as one frame. Data in one codeword is also one frame of data. One codeword is a basic data unit for decoding performed by the decoding device. One codeword may include bits in a plurality of rows and a plurality of columns. One column of bits or one row of bits may form one sub-codeword. In other words, one codeword includes a plurality of sub-codewords. Each sub-codeword includes a plurality of bits. Bits belonging to the same sub-codeword are located in the same row of the codeword or the same column of the codeword. For example, one codeword includes 128*128 bits. Herein, every 128 bits are one row, and every 128 bits are one column. In other words, the codeword may include 128 row sub-codewords or 128 column sub-codewords. The coding device 101 may perform coding by using a coding scheme of a staircase (staircase) product code (turbo product code, TPC). Bits of a codeword obtained in the coding scheme are protected by a row BCH (Bose Ray-Chaudhuri Hocquenghem) sub-codeword and a column BCH sub-codeword. The coding device 101 performs coding by using one frame of data (for example, 128 bits*128 bits) as a basic unit. Data in two adjacent frames meets a BCH (n, k) coding relationship. Herein, n is a code length of one BCH sub-codeword, and k is an information bit of one BCH sub-codeword. For example, the coding device 101 performs row BCH (256, 239) codeword coding on a $0^{th}$ frame and a $1^{st}$ frame in a data flow, that is, performs coding on data in each row of bits in the $0^{th}$ frame and the $1^{th}$ frame based on rows, to obtain the coded $0^{th}$ frame and the coded $1^{th}$ frame. Then, the coding device 101 performs column BCH (256, 239) codeword coding the coded $1^{th}$ frame and a $2^{nd}$ frame, that is, performs coding on data in each column of bits in the coded $1^{th}$ frame and the coded $2^{nd}$ frame, to obtain the coded $1^{st}$ frame obtained after two times of coding and the coded $2^{nd}$ frame obtained after one time of coding. In this case, each bit in the coded $1^{st}$ frame after two times of coding is protected by one row sub-codeword and one column sub-codeword.

The decoding device 102 is configured to decode the codeword in the received code stream. Each time the decoding device 102 receives a codeword, the decoding device 102 may perform iterative decoding on a target quantity of codewords. The target quantity of codewords may include a newly received codeword and a previously decoded codeword.

Figure 1B:
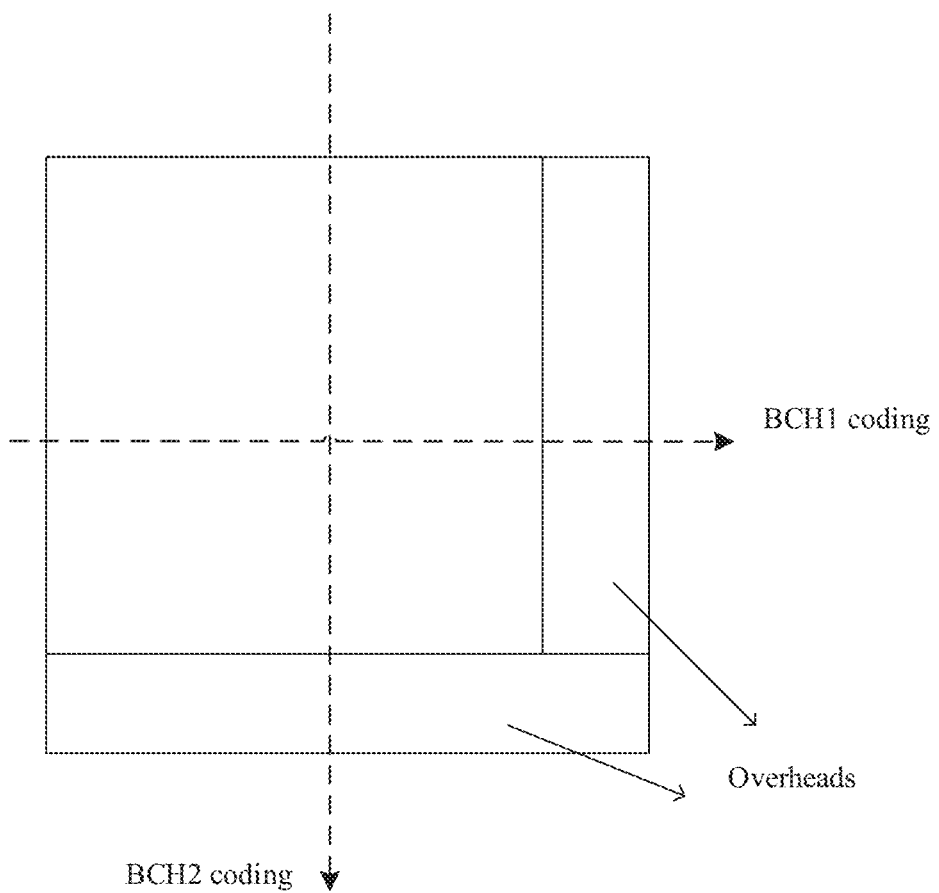
FIG. 1b is a schematic diagram of a structure of a TPC codeword according to an embodiment of this application.
Figure 2:
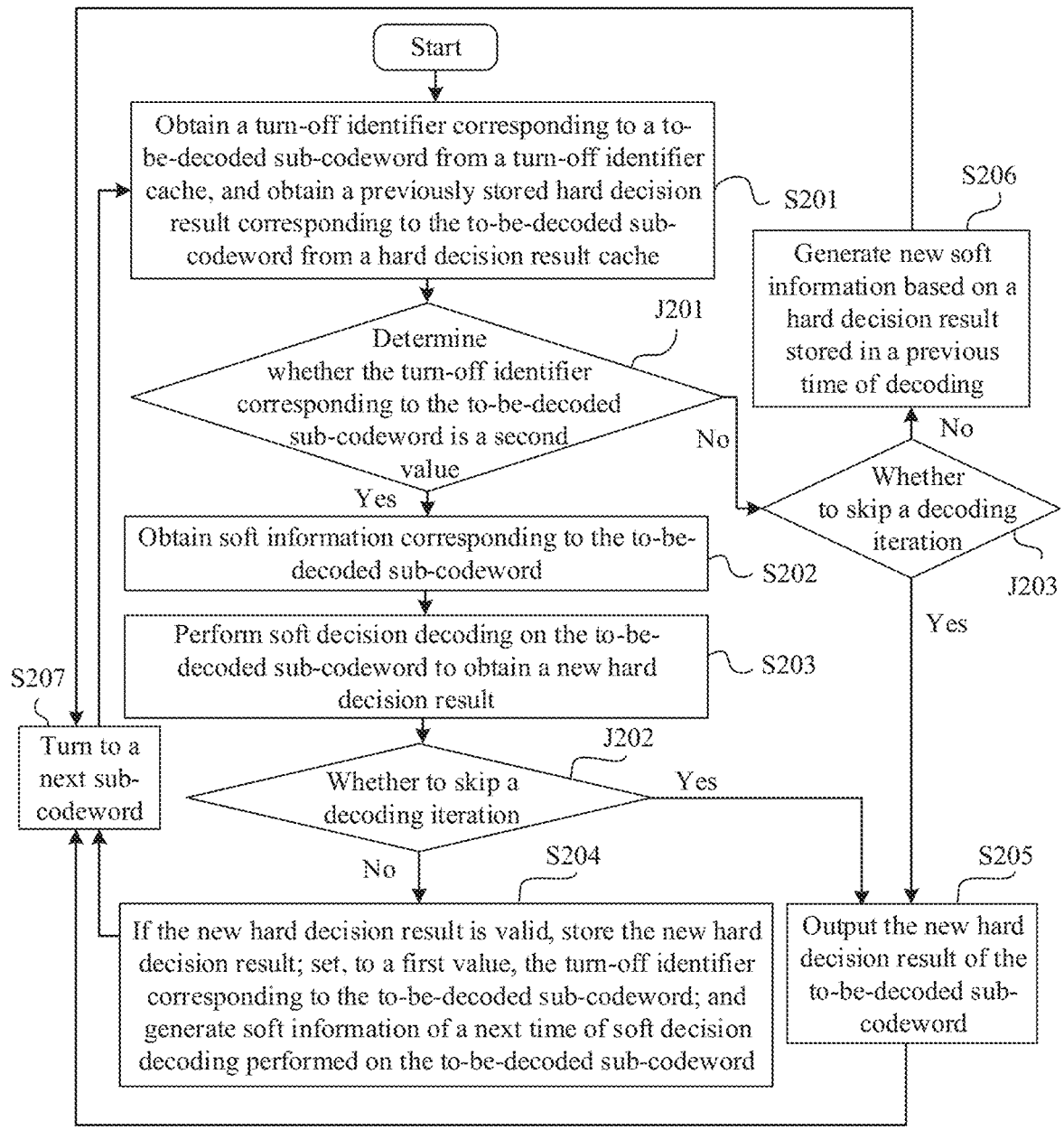
FIG. 2 is a flowchart of a decoding method according to an embodiment of this application.

A TPC codeword is a typical two-dimensional block algebraic code. Joint coding may be performed in two dimensions by using the same algebraic sub-codeword or different algebraic sub-codewords. A codeword structure of the TPC codeword is shown in FIG. 1b (herein, the algebraic sub-codeword is a BCH codeword in an example). The TPC code uses a rectangular (mostly square) information block as a coding unit. First, row coding is performed on each row of the information block by using a BCH codeword 1. Coding overheads are located on a right side of the information block. Then, column coding is performed on each column of the information block and row overheads by using a BCH codeword 2. Coding overheads are located below the information block and the row overheads. According to an inherent mathematical principle of the BCH codeword, a lower right corner is column overheads coded based on the information block and the row overheads. A row BCH codeword 1 coding relationship is automatically met from a perspective of a row dimension. After the coding, the information block and the row and column overheads form a larger rectangular data block unit, that is, one TPC codeword.

At a decoding end, row/column iterative decoding is performed by using a TPC codeword as a basic decoding unit. In a specific quantity of iterations, decoding performance is improved with an increase of the quantity of iterations. A row/column decoding kernel in the iterative decoding may use a hard decision decoding kernel with relatively low complexity, or may use a soft-in-soft-out (SISO) soft decision decoding kernel with better performance, or may be designed as dynamic decoding architecture that can be switched according to a condition.

When the hard decision decoding kernel is used, only one decoding cache with bit width of 1 bit: RAM_HD is needed. After each time of row/column decoding, only bits at a corresponding location in RAM_HD need to be flipped based on a decoding result. Values of bits in RAM_HD are constantly updated in iterations. After the iterative decoding is completed, a final state of RAM_HD is output as a decoding result.

When the SISO decoding kernel is used, two decoding caches in which a bit width is a plurality of bits: RAM_LLR and RAM_EX are needed to be respectively used to store an LLR (Log Likelihood Ratio, log likelihood ratio) value of each bit obtained from a channel and an extrinsic information value obtained after each time of row/column iterative decoding. In a decoding process of each TPC codeword, content of RAM_LLR remains unchanged, and RAM_EX is correspondingly updated based on the extrinsic information value obtained after each time of row/column decoding. Input soft information in each row/column decoding is calculated based on both of extrinsic information EX_info obtained after a previous time of column/row decoding and an LLR value. After the iterative decoding is completed, a hard decision result of a final time of decoding may be simply output as a final decoding result.

The decoding method, the decoder, and the decoding apparatus disclosed in this application are performed by using a sub-codeword as a unit, for example, the foregoing TPC codeword. It is assumed that one TPC codeword including n rows and n columns. In other words, a total of 2*n sub-codewords exist. During decoding, each of the 2*n sub-codewords may be decoded by using the decoding method in this application.

It should be noted that a turn-off identifier cache, a hard decision result cache, or a soft information cache mentioned below in the embodiments of this application may be a storage object caching system or a memory. The memory may include a register and a volatile memory (volatile memory), for example, a random access memory (RAM).

The memory may also include a non-volatile memory (non-volatile memory), for example, a flash memory (flash memory), a hard disk drive (HDD), a solid-state drive (SSD), cloud storage (cloud storage), network attached storage (NAS), or a network drive (network drive). The memory may further include a combination of the foregoing types of memories, or another medium or product in any form with a storage function.

To make a person skilled in the art more clearly understand the technical solutions provided in the embodiments of this application, the following uses a specific embodiment to describe in detail the decoding method provided in the embodiments of this application. For example, a to-be-decoded codeword in this embodiment may use a staircase (staircase) TPC coding scheme. When decoding is performed on a plurality of sub-codewords, a specific quantity of decoding iterations is generally preset. In an $N^{th}$ decoding iteration (the $N^{th}$ decoding iteration may be any decoding iteration other than a first decoding iteration in a preset quantity of soft decision decoding iterations), a specific process of the decoding method in this application may include:

S201: Obtain a turn-off identifier corresponding to a to-be-decoded sub-codeword from a turn-off identifier cache, and obtain a previously stored hard decision result corresponding to the to-be-decoded sub-codeword from a hard decision result cache.

A decoding end selects the to-be-decoded sub-codeword for decoding. Each to-be-decoded sub-codeword has a corresponding turn-off identifier. The turn-off identifier is stored in the turn-off identifier cache. The turn-off identifier corresponding to the to-be-decoded sub-codeword is obtained from the turn-off identifier cache. In addition, the hard decision result cache is set to store the hard decision result in a decoding iteration. The previously stored hard decision result corresponding to the to-be-decoded sub-codeword is obtained from the hard decision result cache.

J201: Determine whether a value indicated by the turn-off identifier corresponding to the to-be-decoded sub-codeword is a second value.

When the value indicated by the turn-off identifier corresponding to the to-be-decoded sub-codeword is the second value (for example, 0). S202 is performed. When the value indicated by the turn-off identifier corresponding to the to-be-decoded sub-codeword is not the second value or is a first value (for example, 1). J203 is performed.

The turn-off identifier corresponding to the to-be-decoded sub-codeword is used to determine whether soft decision decoding needs to be performed on the to-be-decoded sub-codeword in the current decoding iteration. If the value indicated by the turn-off identifier corresponding to the to-be-decoded sub-codeword is the second value (for example, 0), it indicates that a valid hard decision result is not obtained in a previous soft decision decoding process, and decoding continues to be performed to improve decoding performance. If the value indicated by the turn-off identifier corresponding to the to-be-decoded sub-codeword is not the second value or is the first value (for example, 1), it indicates that a valid hard decision result is obtained in a previous soft decision decoding process. Soft decision decoding does not need to be performed in the current decoding iteration, thereby reducing a quantity of decoding times and reducing decoding power consumption.

It should be noted that step S202 may be directly started when a first time of iterative decoding is performed on a sub-codeword, and step S201 may be started when a second time of iterative decoding and a subsequent decoding iteration are performed.

S202: Obtain soft information corresponding to the to-be-decoded sub-codeword.

The soft information corresponding to the to-be-decoded sub-codeword is obtained from a soft information cache in the current decoding iteration.

Figure 3A:
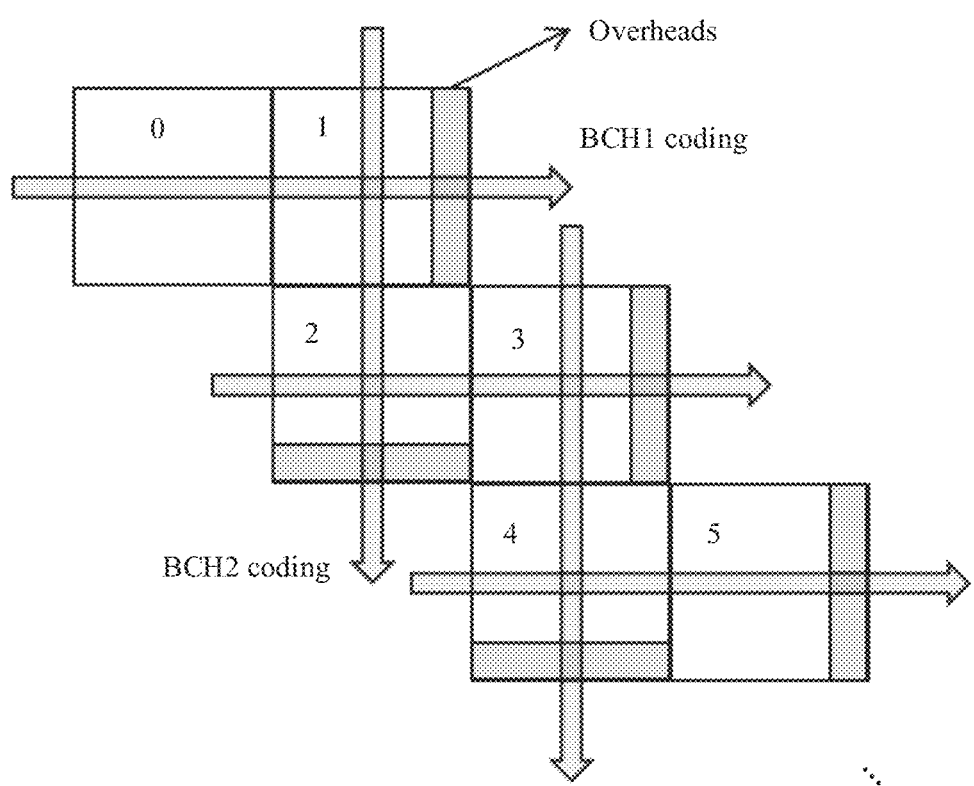
FIG. 3a is a schematic diagram of a coding scheme of a codeword according to an embodiment of this application.

Specifically, the staircase TPC coding scheme used for the codeword in which the to-be-decoded sub-codeword is located may be shown in FIG. 3a. Each bit for which the coding scheme is used is coded and protected by using two BCH sub-codewords: a row BCH sub-codeword 1 and a column BCH sub-codeword 2. Therefore, the coding scheme may be referred to as a soft decision BCH algorithm. For example, a BCH codeword (512, 491) that can be used to correct three errors is used for both the row BCH sub-codeword 1 and the column BCH sub-codeword 2 (the BCH sub-codeword 1 and the BCH sub-codeword 2 may alternatively be implemented by using different BCH codewords). A frame of data (256*256 bits) is used as a unit for coding, and two adjacent frames of data are coded by using one type of BCH codeword. As shown in FIG. 3, a frame 0 and a frame 1 are coded by using a row BCH codeword 1 (512, 491), and are rowly 256 BCH codewords with a length of 512 bits after being coded. Then, the frame 1 and a frame 2 are coded by using a column BCH codeword 2 (512, 491) (herein, the same BCH coding scheme or different BCH coding schemes may be used for the BCH codeword 1 and the BCH codeword 2), and are columnly also 256 BCH codewords with a length of 512 bits after being coded.

The soft information corresponding to the to-be-decoded sub-codeword indicates soft information of a value of each bit in the to-be-decoded sub-codeword, and includes the value and confidence of the value. The soft information is mathematically represented as a logarithm of a ratio of a posterior probability that each bit is equal to 1 to a posterior probability that each bit is equal to 0. When a value of the soft information is positive, it indicates that the bit is more likely to be equal to 1; when a value of the soft information is negative, it indicates that the bit is more likely to be equal to 0. An absolute value of the soft information can indicate reliability of a corresponding value. A larger absolute value indicates a more reliable value.

For example, soft information of a bit in a sub-codeword can be obtained by using the following algorithm:

$$APP_N = LLR + Ex\_info_{N-1} * \alpha \quad (1)$$

Herein, $APP_N$ represents soft information of a bit in an $N^{th}$ decoding iteration; LLR (Log Likelihood Ratio, log likelihood ratio) represents initial confidence of channel input; $Ex\_info_{N-1}$ is extrinsic information output after an $(N-1)^{th}$ decoding iteration; and a is a weight coefficient, and a gradually increases in an iteration process.

It can be learned from the foregoing algorithm that, during the first time of decoding, LLR information that is of each bit in each codeword and that is input over a channel is obtained as soft information; during the second time of decoding and in a step of subsequent soft decision decoding, soft information of each bit is obtained based on extrinsic information Ex_info corresponding to the bit and the LLR information that is of the bit in the to-be-decoded codeword and that is input over the channel.

S203: Perform soft decision decoding on the to-be-decoded sub-codeword to obtain a new hard decision result.

(1) Generate at least one test sequence for the to-be-decoded sub-codeword based on soft information of each bit in the to-be-decoded sub-codeword.

A core idea of the foregoing soft decision BCH algorithm is to try to estimate and correct a sub-codeword error by using a limited quantity of test error patterns. Therefore, generating a test sequence is a key step in the algorithm. A quantity of test sequences also affects performance of the algorithm greatly. Based on what is mentioned above, an absolute value of soft information of a bit can indicate confidence of a value of the bit. A smaller absolute value indicates a less reliable value of the bit and a higher probability that the bit is an erroneous bit. Therefore, for a sub-codeword in a codeword. P bits with smallest absolute values of soft information in the sub-codeword are first selected, and it is considered that errors of the sub-codeword are most likely to appear at the P locations (P is an integer greater than zero, and a value of P can be set according to a need, which is not limited herein). Then, 2P test sequences (Test Sequences, TSs) are constructed according to the P locations. A specific construction method is as the following example.

After the P bits of the to-be-decoded sub-codeword are selected, the P bits of the to-be-decoded sub-codeword are sequentially traversed by using values: 0 and 1, and bits other than the P bits in the sub-codeword are 0, to obtain 2P basic sequences (Basic Sequence, BS).

For example, it is assumed that P=2 and the two locations are the $3^{rd}$ bit and the $7^{th}$ bit of the sub-codeword. In this case, values of the $3^{rd}$ bit and the $7^{th}$ bit are set to 1 and 0 separately in sequence. In this way, 22=4 BSs (BS 1 to BS 4) are obtained, as shown in FIG. 4.

After the BSs are obtained, a decoding result that is of the to-be-decoded sub-codeword and that is obtained through hard decision decoding performed on the soft information of the to-be-decoded sub-codeword is obtained and denoted as D0, and 2P TSs of the sub-codeword are obtained based on DO of the to-be-decoded sub-codeword and the 2P BSs of the sub-codeword. Specifically, addition modulo 2 may be performed on DO of the to-be-decoded sub-codeword and the 2P basic sequences of the sub-codeword to obtain the 2P TSs. For example, the four BSs (BS 1 to BS 4) shown in FIG. 4 are used for constructing TSs, and obtained TSs (TS 1 to TS 4) may be shown in FIG. 5.

(2) Perform soft decision decoding on the to-be-decoded sub-codeword based on all the test sequences generated for the to-be-decoded sub-codeword to obtain at least one valid sub-codeword of the to-be-decoded sub-codeword.

After the soft decision decoding, K output sub-codewords are obtained, that is, K valid sub-codewords, where K≤2P. This is because some TSs may exceed a decoding capability, and therefore, decoding cannot be performed normally.

(3) Select an optimal valid sub-codeword from all the valid sub-codewords of the to-be-decoded sub-codeword as a new hard decision result of the sub-codeword.

For example, selecting the optimal valid sub-codeword from the K valid sub-codewords obtained after the soft decision decoding performed on the to-be-decoded sub-codeword may be as follows:

First, Euclidean distances between the soft information of the sub-codeword and the K valid sub-codewords of the sub-codeword are obtained. The Euclidean distances may be obtained by using a Euclidean distance formula based on a value of each bit of each valid sub-codeword of the sub-codeword and soft information of each bit of the codeword, for example:

$$d_i = \sqrt{\sum_{k=1}^{N}(x_{1k} - x_{2k})^2} \quad (2)$$

Herein, $d_i$ represents a Euclidean distance between a valid sub-codeword i in K valid sub-codewords of one sub-codeword and soft information of the sub-codeword, the valid sub-codeword i is any one of the K valid sub-codewords of the codeword, $x_{1k}$ represents a value of a $k^{th}$ bit of the valid sub-codeword i, and $x_{2k}$ represents a value of soft information of the $k^{th}$ bit of the sub-codeword.

It should be noted that, during calculation of a Euclidean distance, a value of a bit in a valid sub-codeword needs to be correspondingly converted from (1, 0) to (1, −1), to correspond to a value range of soft information.

Based on the foregoing algorithm, the K Euclidean distances may be obtained based on the K valid sub-codewords. Then, a valid sub-codeword corresponding to a minimum Euclidean distance is selected as an optimal valid sub-codeword to be used as a new hard decision result of the to-be-decoded sub-codeword.

Figure 3B:
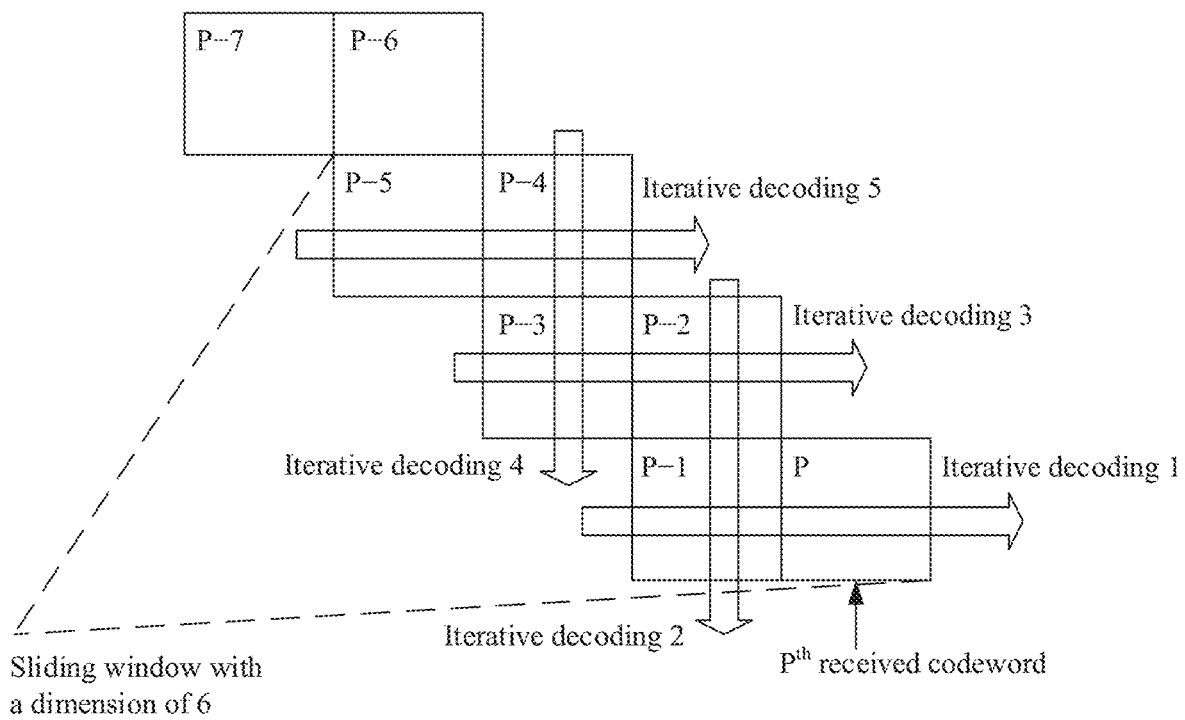
FIG. 3b is a schematic diagram of a decoding scheme of a codeword according to an embodiment of this application.

Optionally, FIG. 3b is a schematic diagram of an iterative decoding process according to an embodiment of this application. A dimension of a sliding window in FIG. 3b is 6. It is assumed that a codeword in the sliding window includes a $(P-6)^{th}$ codeword to a $(P-1)^{th}$ codeword. Herein, the $(P-1)^{th}$ codeword is a $1^{st}$ codeword in the sliding window, and the $(P-1)^{th}$ codeword is a final codeword in the sliding window. The $(P-1)^{th}$ codeword is data of a $(P-1)^{th}$ frame. When the decoding device receives a $P^{th}$ codeword, the sliding window slides for one codeword forward, so that the $P^{th}$ codeword is a $1^{st}$ codeword in the sliding window, the $(P-6)^{th}$ codeword is out of the sliding window after the sliding, and a $(P-5)^{th}$ codeword is a final codeword in the sliding window. The decoding device starts to perform an iterative decoding process on the $(P-5)^{th}$ codeword to the $P^{th}$ codeword. The iterative decoding process includes iterative decoding 1 to 5. The iterative decoding process of the decoding device for the $(P-5)^{th}$ codeword to the $P^{th}$ codeword may be as follows: First, the decoding device 102 performs row soft decision decoding on the $P^{th}$ codeword and the $(P-1)^{th}$ codeword for a time to obtain the decoded $P^{th}$ codeword and the decoded $(P-1)^{th}$ codeword. This is denoted as iterative decoding 1. Then, the decoding device performs column soft decision decoding on the decoded $(P-1)^{th}$ codeword and a $(P-2)^{th}$ codeword to obtain the further decoded $(P-1)^{th}$ codeword and the decoded $(P-2)^{th}$ codeword. This is denoted as iterative decoding 2. Likewise, the decoding device performs iterative decoding 3 to 5. After completing the iterative decoding 5, the decoding device outputs a decoding result of the $(P-5)^{th}$ codeword, that is, outputs the decoded $(P-5)^{th}$ codeword. The row soft decision decoding is to perform soft decision decoding on each sub-codeword in a codeword based on rows. For example, for a codeword, the decoding device first performs soft decision decoding on a first-row sub-codeword in the codeword, and then performs soft decision decoding on a second-row sub-codeword in the codeword. Certainly, the decoding device may also perform soft decision decoding on a plurality of rows of sub-codewords in parallel. The column soft decision decoding is to perform soft decision decoding on each sub-codeword in a codeword based on columns. For example, for a codeword, the decoding device 102 first performs soft decision decoding on a first-column sub-codeword in the codeword, and then performs soft decision decoding on a second-column sub-codeword in the codeword. Certainly, the decoding device may also perform soft decision decoding on a plurality of columns of sub-codewords in parallel.

J202: Determine whether to skip the decoding iteration.

If a quantity of decoding times after the current decoding iteration performed on the to-be-decoded sub-codeword reaches a preset maximum quantity of decoding times, the decoding iteration is skipped, and step S205 is performed. If a quantity of decoding times after the current decoding iteration performed on the to-be-decoded sub-codeword does not reach a preset maximum quantity of decoding times, step S204 is performed.

S204: If a new hard decision result is valid, store the new hard decision result; set, to the first value, the turn-off identifier corresponding to the to-be-decoded sub-codeword; and generate soft information of a next time of soft decision decoding performed on the to-be-decoded sub-codeword. Then, step S207 is performed.

(1) Determine whether the obtained new hard decision result is valid. If the new hard decision result is valid, the new hard decision result is stored in the hard decision result cache, and the value indicated by the turn-off identifier corresponding to the to-be-decoded sub-codeword in the turn-off identifier cache is updated to the first value. Herein, the value indicated by the turn-off identifier is the first value, to indicate that a valid hard decision result is obtained in the current soft decision decoding process. In the next decoding iteration, the soft decision decoding does not need to be performed on the sub-codeword, thereby reducing a quantity of decoding times and reducing decoding power consumption.

Specifically, whether the new hard decision result of the sub-codeword is valid may be determined based on a check matrix and the new hard decision result corresponding to the to-be-decoded sub-codeword. In a possible implementation, a product of the check matrix and the new hard decision result is calculated. When the product is 0, it is considered that the new hard decision result is valid.

Optionally, in BCH decoding, a syndrome matrix of a BCH sub-codeword is calculated to determine whether a new hard decision result is valid. For example, it is assumed that an error correction capability in one time of soft decision decoding is t, that is, t bits can be corrected. Based on the new hard decision result of the BCH sub-codeword, 2t syndromes are calculated. If values of the 2t syndromes are all 0, the new hard decision result is valid. If values of the 2t syndromes include a non-0 value, the new hard decision result is invalid. Herein, validity determined through calculating a syndrome matrix of a BCH sub-codeword is default validity in the decoding algorithm, that is, a specified manner of determining validity for a decoding result in the decoding algorithm. In practice, a bit error rate may exist. This application does not limit a method for determining based on the decoding algorithm whether a decoding result is valid.

(2) Obtain extrinsic information of each bit in the sub-codeword based on the soft information of each bit in the sub-codeword, the new hard decision result, and a suboptimal valid sub-codeword, and generate the soft information of the next time of soft decision decoding based on the extrinsic information.

Performance of used FEC is improved in a manner of combining convolutional coding with window decoding. Therefore, after current soft decision decoding is completed, extrinsic information Ex_info that is of each bit and that is obtained through the current decoding needs to be calculated and transferred to next soft decision decoding, to generate soft information for the next soft decision decoding, thereby implementing effective transfer of confidence in a decoding process.

For example, the extrinsic information can be obtained according to the following algorithm:

$$w_j = \left(\frac{|R-C|^2 - |R-D|^2}{4}\right) d_j - r_j \quad (3)$$

Herein, $w_j$ represents extrinsic information of a $j^{th}$ bit of a sub-codeword; R represents input soft information of soft decision decoding; D is an optimal valid sub-codeword of the sub-codeword, that is, the new hard decision result; C is a suboptimal valid sub-codeword (a best valid sub-codeword other than an optimal valid sub-codeword in all valid sub-codewords of the sub-codeword may also be referred to as a contention sub-codeword); and $d_j$ is a value (1/−1) of the $j^{th}$ bit of D. Because a value of P is limited, C that meets the foregoing requirement may not be found in K output results. In this case, extrinsic information of the bit may be obtained by using the following approximation algorithm:

$$w_j = \beta d_j \quad (4)$$

Herein, β is a weight coefficient. As a value of a decoding procedure slowly increases, a specific value of β may be obtained through simulation optimization.

It can be learned that a decoding result of each time of soft decision decoding affects a next time of soft decision decoding through extrinsic information. Therefore, each time of soft decision decoding performed on a sub-codeword can also be referred to as one decoding iteration of the sub-codeword.

Optionally, a value of at least one first bit in the new hard decision result is different from a value of the first bit in a previously stored hard decision result of the to-be-decoded sub-codeword. For example, a to-be-decoded sub-codeword in the current decoding iteration is a first-row sub-codeword. A value of a first bit in the first-row sub-codeword in the current hard decision result is different from a value of the first bit in the first-row sub-codeword in the previous stored hard decision result. The first bit further corresponds to a first-column sub-codeword. The first-column sub-codeword and the first-row sub-codeword intersect at the first bit. In this case, the turn-off identifier corresponding to the first-column sub-codeword is set to a second value (for example, 0). When the value indicated by the turn-off identifier is the second value, the soft decision decoding needs to be performed on the first-column sub-codeword in a next decoding iteration.

Figure 6:
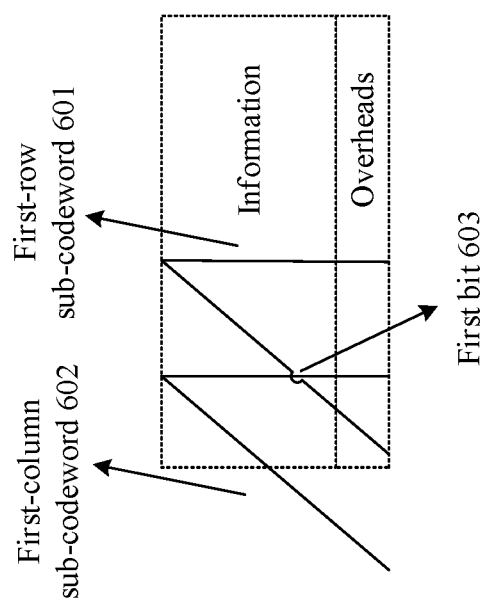
FIG. 6 is a flowchart of a decoding method according to an embodiment of this application.

It should be noted that the first-row sub-codeword and the first-column sub-codeword mentioned in this embodiment of this application may also be two associated sub-codewords, and do not need to strictly follow a general row-column arrangement manner. In addition, bits in a sub-codeword are not necessarily arranged in rows. This is not limited in this application. For example, as shown in FIG. 6, the first-row sub-codeword 601 and the first-column sub-codeword 602 intersect at a first bit 603 (at a semi-circular projection part in FIG. 6). The first-row sub-codeword 601 and the first-column sub-codeword 602 are associated by using the first bit 603. The first bit 603 corresponds to the first-row sub-codeword 601 and the first-column sub-codeword 602. The first-row sub-codeword 601 and the first-column sub-codeword 602 may also be arranged in a bent form in FIG. 6.

S205: Output the obtained new hard decision result of the to-be-decoded sub-codeword. Then, step S207 is performed until a final decoding iteration performed on a final sub-codeword in all to-be-decoded sub-codewords is performed.

J203: Determine whether to skip the decoding iteration.

If a quantity of decoding times after the current decoding iteration performed on the to-be-decoded sub-codeword reaches a preset maximum quantity of decoding times, the decoding iteration is skipped, and step S205 is performed. If a quantity of decoding times after the current decoding iteration performed on the to-be-decoded sub-codeword does not reach a preset maximum quantity of decoding times, step S206 is performed.

S206: Generate new soft information based on the hard decision result stored in the previous time of decoding. Then, step S207 is performed.

The new soft information is generated based on the obtained hard decision result in the previous decoding iteration. Specifically, the new soft information is generated based on a symbol value corresponding to the hard decision result in the previous decoding iteration (data of each bit in the hard decision result generally has two values: 0 and 1, for example, a symbol value corresponding to 1 is positive, and a symbol value corresponding to 0 is negative) and a bit width value of the soft information. The new soft information is stored in the soft information cache. Generally, a product of the bit width value of the soft information and the symbol value corresponding to the hard decision result is used as output soft information. Preferably, the bit width value of the soft information is preferentially a maximum bit width value or a relatively large bit width value that is allowed for a bit width of the soft information.

S207: Turn to a next sub-codeword.

After the current decoding iteration performed on the to-be-decoded sub-codeword is completed, the decoding iteration is performed on the next sub-codeword. The next sub-codeword may be a row sub-codeword or a column sub-codeword.

In the decoding method disclosed in this application, a sub-codeword in a codeword is used as a basic decoding unit. Decoding accuracy is improved in comparison with a case in which a codeword is used as a decoding unit in the conventional technologies. In the conventional technologies, a codeword is used as a decoding unit. When soft decision decoding needs to be performed on a bit in a codeword, the soft decision decoding needs to be performed on the entire codeword again. In the technical solutions of this application, only a sub-codeword in which the bit is located needs to be decoded, thereby greatly reducing decoding power consumption.

In the decoding method disclosed in this application, a turn-off identifier is added for each to-be-decoded sub-codeword. After each decoding iteration, a value indicated by the turn-off identifier is updated. If a valid hard decision result has been generated for a sub-codeword, a value indicated by the turn-off identifier of the sub-codeword is updated to the first value, to indicate that soft decision decoding does not need to be performed in a next decoding iteration. If a valid decoding result has not been obtained for a bit in a sub-codeword, the value indicated by the turn-off identifier of the sub-codeword is updated to the second value, to indicate that soft decision decoding needs to be performed again in a next decoding iteration. In the decoding method disclosed in this application, decoding power consumption is greatly reduced, and decoding efficiency is improved.

The terms "first", "second", and the like in this application are used to distinguish between similar objects, and do not need to be used to describe a specific sequence or order. It should be understood that data used in these terms may be interchangeable in an appropriate case, so that the embodiments described herein can be implemented in a sequence not described in this application. The term "and/or" is used to describe an association relationship between associated objects, and indicates that three relationships may exist. For example, A and/or B may represent the following cases: Only A exists, both A and B exist, and only B exists. A specific operation method in a method embodiment may also be applied to an apparatus embodiment. In addition, to more clearly reflect a relationship between components in different embodiments, in this application, the same reference numeral is used to represent components with the same function or similar functions in different embodiments.

It should be noted that "at least one" described in the embodiments of this application indicates "one" or "more than one". For example, "include at least one of A, B, and C" may indicate the following meanings:

(1) including A:
(2) including B;
(3) including C:
(4) including A and B;
(5) including A and C:
(6) including B and C; and
(7) including A, B, and C.

It should be further noted that, unless otherwise specified, specific descriptions of some technical features in an embodiment may also be used to explain corresponding technical features mentioned in another embodiment. For example, limitation on meanings of the first value or the second value in an embodiment is also applicable to another embodiment.

Figure 7:
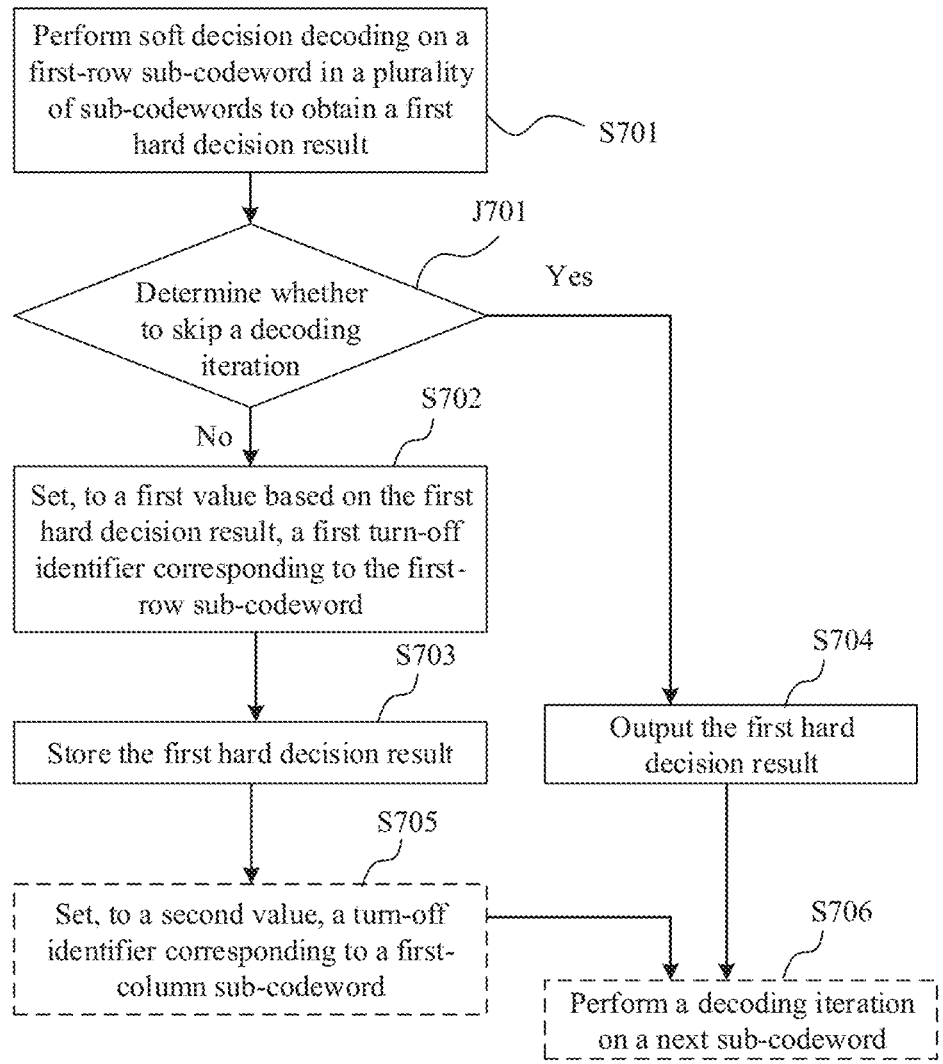
FIG. 7 is a flowchart of a decoding method according to an embodiment of this application.

FIG. 7 is a flowchart of a decoding method according to this application. In the following method procedure, S is used to represent an execution-type step, and J is used to represent a determining-type step. As shown in FIG. 7, the decoding method includes the following steps:

S701: Perform soft decision decoding on a first-row sub-codeword in a plurality of sub-codewords to obtain a first hard decision result.

The soft decision decoding is performed on the first-row sub-codeword in the plurality of sub-codewords of a codeword to obtain the first hard decision result. For a process of the soft decision decoding, refer to related descriptions of step 203. Optionally, the first hard decision result is a valid sub-codeword of the first-row sub-codeword. An optimal valid sub-codeword is preferentially selected.

J701: Determine whether to skip a decoding iteration. If it is determined to skip the decoding iteration, perform step S704. If it is determined not to skip the decoding iteration, perform step S702.

If a quantity of decoding times after the current decoding iteration performed on the first-row sub-codeword reaches a preset maximum quantity of decoding times, the decoding iteration is skipped, and step S704 is performed. If a quantity of decoding times after the current decoding iteration performed on the first-row sub-codeword does not reach a preset maximum quantity of decoding times, step S702 is performed.

S702: Set, to a first value (for example, 1) based on the first hard decision result, a first turn-off identifier corresponding to the first-row sub-codeword.

It is determined based on the first hard decision result that the first hard decision result is a valid decoding result. The first-row sub-codeword corresponds to the first turn-off identifier. The first turn-off identifier is stored in a turn-off identifier cache. A value indicated by the first turn-off identifier is set to a first value. The first turn-off identifier is used to indicate whether to perform soft decision decoding on the first-row sub-codeword in a next decoding iteration. When the value indicated by the first turn-off identifier is the first value (for example, 1), the soft decision decoding is not performed on the first-row sub-codeword in the next decoding iteration, because the valid first hard decision result has been obtained in step S701.

S703: Store the first hard decision result.

The first hard decision result is stored in a hard decision result cache. Then, step S705 may be optionally performed.

S704: Output the first hard decision result.

Step S701 to step S704 are steps in a first decoding iteration performed on a sub-codeword.

Steps S705 and S706 are optional steps.

S705: Set, to a second value, a turn-off identifier corresponding to a first-column sub-codeword.

Before step S701 is performed, if the hard decision result cache stores a hard decision result obtained after soft decision decoding previously performed on the first-row sub-codeword, a value of at least one first bit in the first hard decision result obtained in the current decoding iteration is different from a value of the first bit in the previously stored hard decision result of the first-row sub-codeword. The first bit corresponds to the first-column sub-codeword. The first-column sub-codeword and the first-row sub-codeword intersect at the first bit.

The turn-off identifier corresponding to the first-column sub-codeword is set to a second value (for example, 0). When a value indicated by the first turn-off identifier is the second value, soft decision decoding needs to be performed on the first-column sub-codeword in a next decoding iteration.

S706: Perform a decoding iteration on a next sub-codeword.

After the current decoding iteration (for example, a fifth decoding iteration) performed on the first-row sub-codeword is completed, the current decoding iteration (for example, the fifth decoding iteration) is performed on the next sub-codeword. The next sub-codeword may be a row sub-codeword or a column sub-codeword.

After the current decoding iteration has been performed on all to-be-decoded sub-codewords in the codeword, a next decoding iteration is further performed. Decoding is completed until a preset quantity of decoding iterations have been performed on all the to-be-decoded sub-codewords in the codeword.

Figure 8:
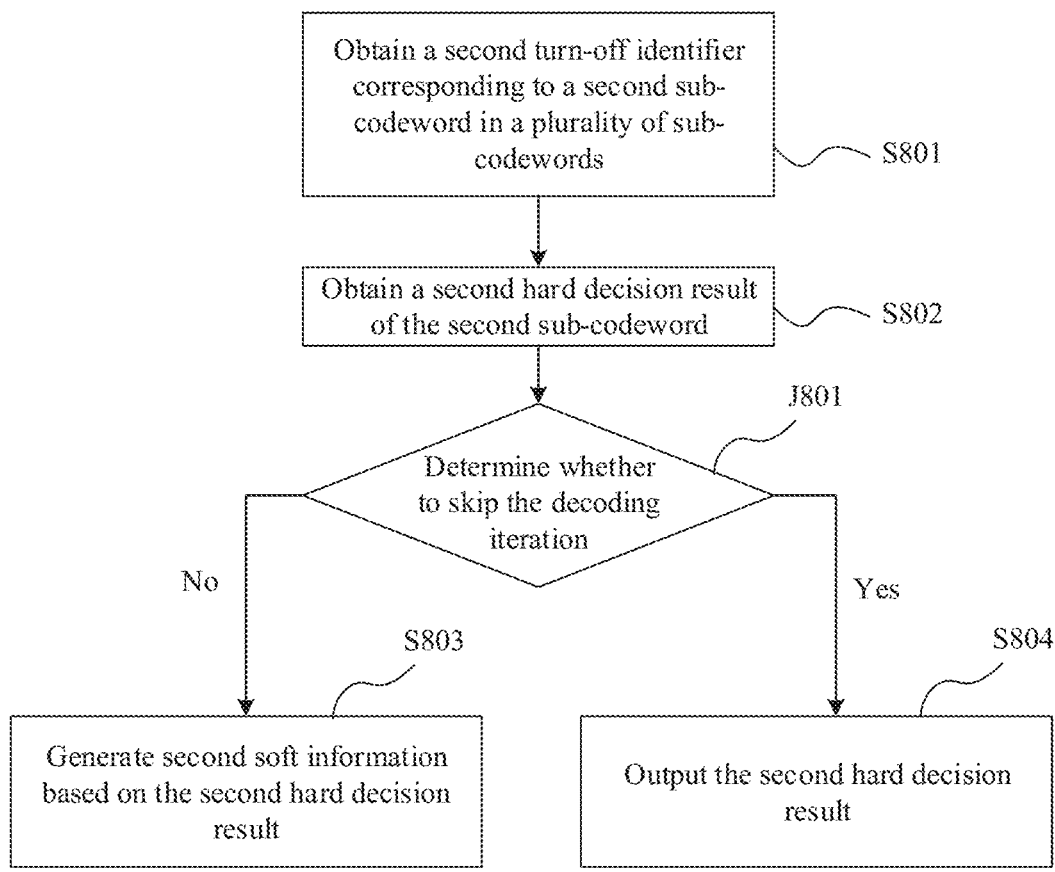
FIG. 8 is a flowchart of a decoding method according to an embodiment of this application.

In a possible implementation, as shown in FIG. 8, performing a decoding iteration on the next sub-codeword in step S706 may include the following steps:

S801: Obtain a second turn-off identifier corresponding to a second sub-codeword in the plurality of sub-codewords. A value indicated by the second turn-off identifier is the first value (for example, 1).

Because the value indicated by the second turn-off identifier corresponding to the second sub-codeword is the first value, it indicates that a valid hard decision result of the second sub-codeword has been obtained in a previous decoding iteration, and therefore, soft decision decoding does not need to be performed on the second sub-codeword in the current decoding iteration.

S802: Obtain a second hard decision result of the second sub-codeword. The second hard decision result is a valid hard decision result obtained in a decoding iteration before the current decoding iteration.

J801: Determine whether to skip the decoding iteration. When the decoding iteration is not skipped, step S803 is performed. When the decoding iteration is skipped, step S804 is performed.

S803: Generate second soft information based on the second hard decision result. The second soft information is used for soft decision decoding in a next decoding iteration performed on the second sub-codeword.

Optionally, the second soft information is generated based on a symbol value corresponding to the second hard decision result (data of each bit of the hard decision result has generally only two values: 0 and 1, for example, a symbol value corresponding to 1 is positive, and a symbol value corresponding to 0 is negative) and a bit width value of the second soft information, and the second soft information is stored in a soft information cache. Preferably, a maximum bit width value or a relatively large bit width value of the second soft information is preferentially selected for the bit width value of the second soft information.

S804: Output the second hard decision result.

Steps S801 to S804 show a decoding process after valid hard decision results have been obtained for the second sub-codeword in the plurality of sub-codewords.

Figure 9:
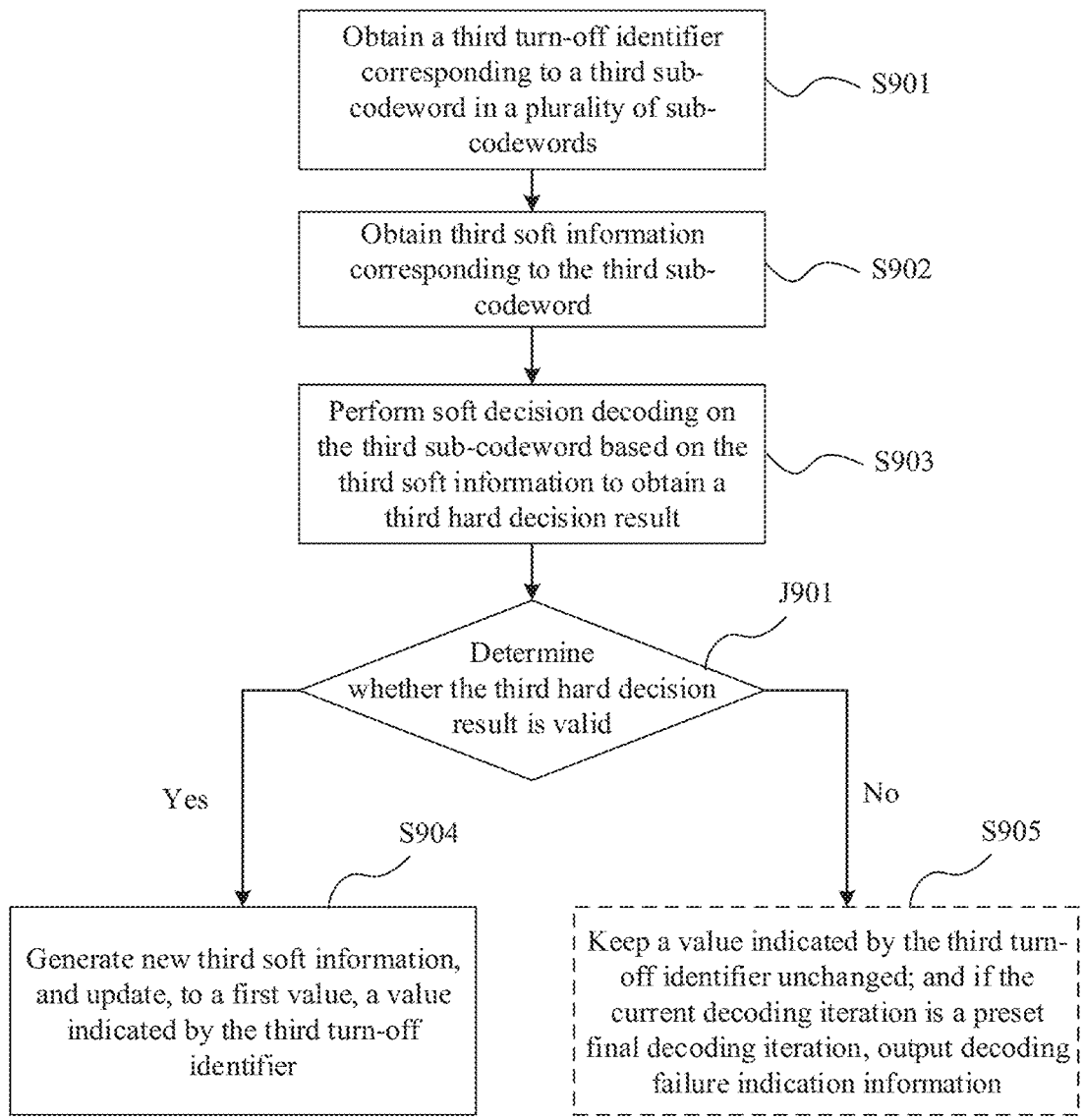
FIG. 9 is a schematic diagram of a structure of a decoder according to an embodiment of this application.

In another possible implementation, as shown in FIG. 9, performing a decoding iteration on the next sub-codeword in step S706 may further include the following steps:

S901: Obtain a third turn-off identifier corresponding to a third sub-codeword in the plurality of sub-codewords. A value indicated by the third turn-off identifier is the second value (for example, 0).

Because the value indicated by the third turn-off identifier corresponding to the third sub-codeword is the second value, it indicates that a valid hard decision result of the third sub-codeword has not been obtained in a previous decoding iteration, and therefore, soft decision decoding does not need to be performed on the third sub-codeword in the current decoding iteration.

S902: Obtain third soft information corresponding to the third sub-codeword. The third soft information is third soft information that corresponds to the third sub-codeword and that is stored in a previous decoding iteration.

S903: Perform soft decision decoding on the third sub-codeword based on the third soft information to obtain a third hard decision result.

J901: Determine whether the third hard decision result is valid. If the third hard decision result is valid, perform step S904. If the third hard decision result is invalid, step S905 may be optionally performed.

Optionally, in BCH decoding, a syndrome matrix of a BCH sub-codeword is calculated to determine whether a new hard decision result is valid.

S904: Generate new third soft information, and update, to the first value, the value indicated by the third turn-off identifier corresponding to the third sub-codeword. The new third soft information is used for a subsequent decoding iteration performed on the third sub-codeword.

Because the valid hard decision result of the third sub-codeword has been obtained, the soft decision decoding does not need to be performed on the third sub-codeword in a next decoding iteration to reduce decoding power consumption. In this case, the value indicated by the third turn-off identifier corresponding to the third sub-codeword is updated to the first value.

Specifically, extrinsic information of each bit in the third sub-codeword is obtained based on the soft information of each bit in the third sub-codeword and the third hard decision result, and the new third soft information is generated based on the extrinsic information.

Optionally, if the current decoding iteration performed on the third sub-codeword is a preset final decoding iteration, the decoding iteration is skipped, and the third hard decision result is output.

S905: If the third hard decision result is invalid, the value indicated by the third turn-off identifier remains unchanged. If the current decoding iteration performed on the third sub-codeword is the preset final decoding iteration, decoding failure indication information of the third sub-codeword is output.

Steps S901 to S905 show a decoding process after valid hard decision results have not been obtained for the third sub-codeword in the plurality of sub-codewords.

In the decoding method disclosed in this embodiment, a decoding procedure of a first decoding iteration performed on a sub-codeword, a decoding procedure for a sub-codeword for which a valid hard decision result has been obtained, and a decoding procedure for a sub-codeword for which a valid hard decision result has not been obtained are separately disclosed. In the decoding method disclosed in this application, decoding power consumption is greatly reduced, and decoding efficiency is improved.

Figure 10:
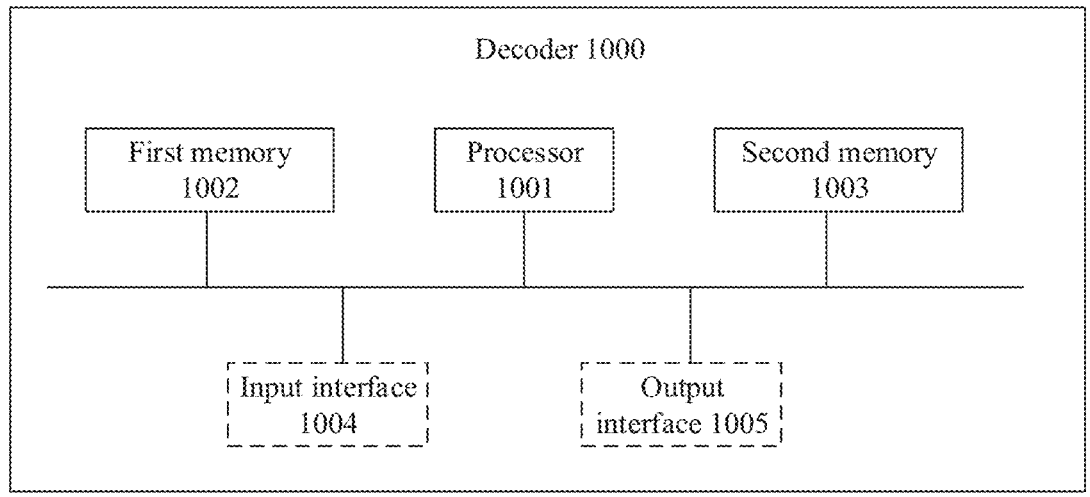
FIG. 10 is a schematic diagram of a structure of a decoding apparatus according to an embodiment of this application.

FIG. 10 shows a decoder disclosed in an embodiment of this application. As shown in FIG. 10, the decoder 1000 includes a processor 1001, a first memory 1002, and a second memory 1003.

The processor 1001 is configured to perform soft decision decoding on a first-row sub-codeword in a plurality of sub-codewords to obtain a first hard decision result.

The second memory 1003 is configured to store the first hard decision result.

The first memory 1002 is configured to store a first turn-off identifier corresponding to the first-row sub-codeword.

The processor 1001 is further configured to set the first turn-off identifier to a first value. The first turn-off identifier is used to indicate whether to perform soft decision decoding on the first-row sub-codeword in a next decoding iteration. The soft decision decoding is not performed on the first-row sub-codeword in the next decoding iteration when a value indicated by the first turn-off identifier is the first value.

The processor 1001 is further configured to store the first hard decision result in the second memory 1003.

The first memory and the second memory are merely used for distinguishing different stored information. Actually, the first memory and the second memory may be different parts of the same memory, for example, may be two independent caches or RAMs in the same memory.

In a possible implementation, the decoder 1000 may further include an output interface 1005. The output interface 1005 is configured to output the first hard decision result obtained through decoding the first-row sub-codeword.

In a possible design, the processor 1001 is further configured to: determine that a value of at least one first bit in the first hard decision result is different from a value of the first bit in a hard decision result stored before the soft decision decoding is performed on the first-row sub-codeword. The first bit corresponds to a first-column sub-codeword. The first-column sub-codeword and the first-row sub-codeword intersect at the first bit.

The processor 1001 is further configured to: set, to a second value, a turn-off identifier corresponding to the first-column sub-codeword; and when a value indicated by the turn-off identifier corresponding to the first-column sub-codeword is the second value, need to perform soft decision decoding on the first-column sub-codeword in a next decoding iteration.

In another possible implementation, the decoder 1000 further includes an input interface 1004.

The input interface 1004 is configured to obtain a second turn-off identifier corresponding to a second sub-codeword in the plurality of sub-codewords. A value indicated by the second turn-off identifier is the first value.

The input interface 1004 is further configured to obtain a second hard decision result of the second sub-codeword.

The processor 1001 is further configured to determine whether to skip a decoding iteration; and when the decoding iteration is not skipped, the processor 1001 generates second soft information based on the second hard decision result, where the second soft information is used for soft decision decoding in a next decoding iteration performed on the second sub-codeword; or when the decoding iteration is skipped, the output interface 1005 is further configured to output the second hard decision result.

In a possible design, the input interface 1004 is further configured to obtain a third turn-off identifier corresponding to a third sub-codeword in the plurality of sub-codewords. A value indicated by the third turn-off identifier is the second value.

The input interface 1004 is further configured to obtain third soft information corresponding to the third sub-codeword.

The processor 1001 is further configured to perform soft decision decoding on the third sub-codeword based on the third soft information to obtain a third hard decision result.

When the processor 1001 determines that the third hard decision result is valid, the processor 1001 is further configured to generate new third soft information. The new third soft information is used for a subsequent decoding iteration performed on the third sub-codeword. The processor 1001 is further configured to update the value indicated by the third turn-off identifier to the first value.

Further, after the processor 1001 performs soft decision decoding on the third sub-codeword based on the third soft information to obtain the third hard decision result, the processor 1001 is further configured to skip the decoding iteration. The output interface 1005 is further configured to output the third hard decision result.

That the processor 1001 determines whether to skip the decoding iteration includes:

The processor 1001 determines whether a current quantity of iterations reaches a preset quantity of iterations; and skips the decoding iteration when the current quantity of iterations reaches the preset quantity of iterations; or does not skip the decoding iteration when the current quantity of iterations does not reach the preset quantity of iterations.

Figure 11:
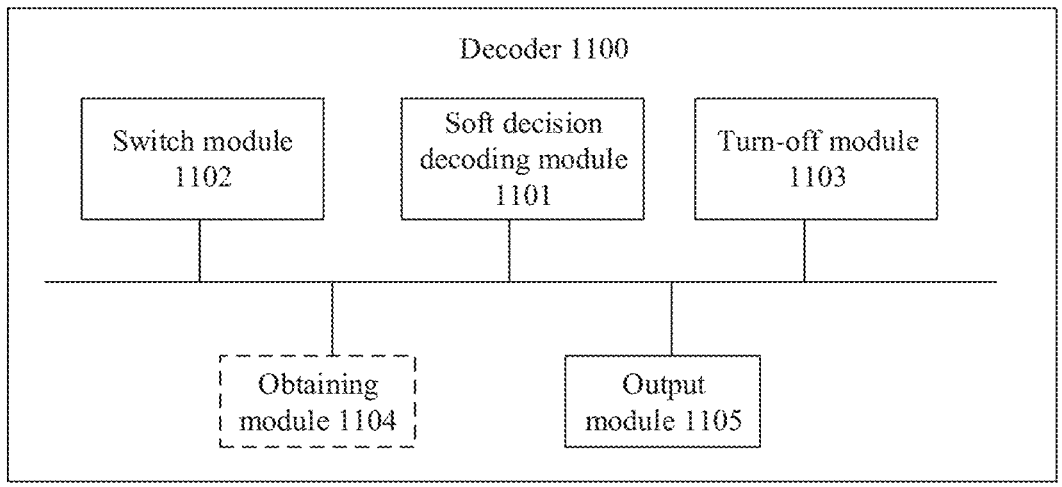
FIG. 11 is a schematic diagram of a decoder according to an embodiment of this application.

FIG. 11 shows a decoder disclosed in an embodiment of this application. As shown in FIG. 11, the decoder 1100 includes a soft decision decoding module 1101, a switch module 1102, a turn-off module 1103, and an output module 1105.

The soft decision decoding module 1101 is configured to perform soft decision decoding on a first-row sub-codeword in a plurality of sub-codewords to obtain a first hard decision result.

The switch module 1102 is configured to determine whether to skip a decoding iteration; and when the decoding iteration is not skipped, the turn-off module 1103 sets, to a first value, a first turn-off identifier corresponding to the first-row sub-codeword, where the first turn-off identifier is used to indicate whether to perform soft decision decoding on the first-row sub-codeword in a next decoding iteration, and the soft decision decoding is not performed on the first-row sub-codeword in the next decoding iteration when a value indicated by the first turn-off identifier is the first value.

When the decoding iteration is skipped, the output module 1105 outputs the first hard decision result obtained through decoding the first-row sub-codeword. In a possible implementation, a value of at least one first bit in the first hard decision result is different from a value of the first bit in a hard decision result stored before the soft decision decoding is performed on the first-row sub-codeword. The first bit corresponds to a first-column sub-codeword. The first-column sub-codeword and the first-row sub-codeword intersect at the first bit.

The turn-off module 1103 sets, to a second value, a turn-off identifier corresponding to the first-column sub-codeword; and when a value indicated by the turn-off identifier corresponding to the first-column sub-codeword is the second value, perform soft decision decoding on the first-column sub-codeword in a next decoding iteration.

In a possible implementation, the decoder 1100 further includes an obtaining module 1104.

The obtaining module 1104 is configured to obtain a second turn-off identifier corresponding to a second sub-codeword in the plurality of sub-codewords. A value indicated by the second turn-off identifier is the first value.

The obtaining module 1104 is further configured to obtain a second hard decision result of the second sub-codeword. The second hard decision result is a valid hard decision result obtained in a decoding iteration before the current decoding iteration.

The switch module 1102 is configured to determine whether to skip the decoding iteration; and when the decoding iteration is not skipped, the soft decision decoding module 1101 generates second soft information based on the second hard decision result, where the second soft information is used for soft decision decoding in a next decoding iteration performed on the second sub-codeword.

When the decoding iteration is skipped, the output module 1105 outputs the second hard decision result.

Optionally, the second soft information is generated based on a symbol value corresponding to the second hard decision result and a bit width value of the second soft information.

In a possible implementation, the obtaining module 1104 is further configured to obtain a third turn-off identifier corresponding to a third sub-codeword in the plurality of sub-codewords. A value indicated by the third turn-off identifier is the second value.

The obtaining module 1104 is further configured to obtain third soft information corresponding to the third sub-codeword.

The soft decision decoding module 1101 is further configured to perform soft decision decoding on the third sub-codeword based on the third soft information to obtain a third hard decision result.

The soft decision decoding module 1101 is further configured to determine whether the third hard decision result is valid; and if the third hard decision result is valid, the soft decision decoding module 1101 generates new third soft information, where the new third soft information is used for a subsequent decoding iteration performed on the third sub-codeword; and the turn-off module 1103 updates the value indicated by the third turn-off identifier to the first value.

Figure 12:
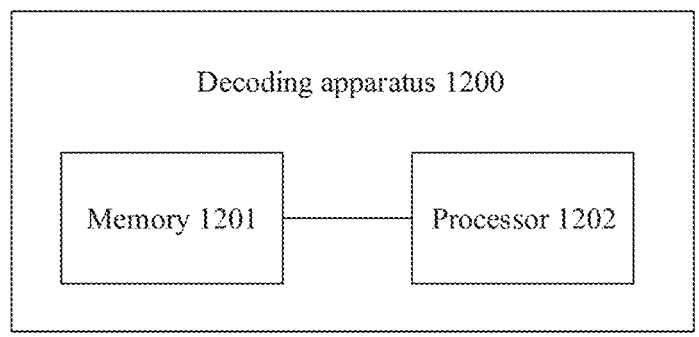
FIG. 12 is a schematic diagram of a decoding apparatus according to an embodiment of this application.

FIG. 12 shows a decoding apparatus disclosed in an embodiment of this application. As shown in FIG. 12, the decoding apparatus 1200 includes a memory 1201 and a processor 1202.

The memory 1201 is configured to store a program.

The processor 1202 is configured to execute the program stored in the memory. When the program is executed, the processor is configured to perform any method described in the foregoing method embodiments.

Optionally, the decoding apparatus is a chip or an integrated circuit.

An embodiment of this application further discloses a computer-readable storage medium. The computer storage medium stores computer-readable instructions. When a computer reads and executes the computer-readable instructions, the computer is enabled to perform any method described in the foregoing method embodiments.

An embodiment of this application further discloses a computer program product. When a computer reads and executes the computer program product, the computer is enabled to perform any method described in the foregoing method embodiments.

An embodiment of this application provides a computer-readable storage medium, including computer readable instructions. When a computer reads and executes the computer readable instructions, the computer is enabled to perform the method performed by the processor.

An embodiment of this application further provides a computer program product including instructions. When the computer program product is run on a computer, the computer is enabled to perform the method performed by the processor.

The same or similar parts of the embodiments of this application may be referred to each other. Specifically, the embodiments shown in FIG. 9 and FIG. 10 are simply described based on the embodiments corresponding to FIG. 2 to FIG. 8. For related parts, refer to the descriptions of the parts of the embodiments corresponding to FIG. 2 to FIG. 8.

It is clear that a person skilled in the art should understand that the foregoing modules or steps in the present invention may be implemented by using a general-purpose computing apparatus, and the modules or steps may be centralized on a single computing apparatus, or distributed on a network including a plurality of computing apparatuses. Optionally, the modules or steps may be implemented by using program code that can be executed by the computing apparatus, so that the modules or steps may be stored in a storage medium (ROM/RAM, magnetic disk, or optical disc) and executed by the computing apparatus. In some cases, the steps shown or described may be performed in a sequence different from that described herein. Alternatively, all or a part of the modules or steps are fabricated into various integrated circuit modules, or into a single integrated circuit module for implementation. In this way, a combination of any specific hardware and software is not limited in the present invention.

Finally, it should be noted that the foregoing descriptions are merely specific implementations of this application, but are not intended to limit the protection scope of this application. Any variation or replacement readily figured out by a person skilled in the art within the technical scope disclosed in this application shall fall within the protection scope of this application.

What is claimed is:

1. A decoding method, wherein the method comprises:
performing soft decision decoding on a first-row sub-codeword in a plurality of sub-codewords of a codeword to obtain a first hard decision result;
determining whether to skip a decoding iteration; and
in response to determining not to skip the decoding iteration:
setting, to a first value based on the first hard decision result, a first turn-off identifier corresponding to the first-row sub-codeword, wherein the first turn-off identifier indicates whether to perform soft decision decoding on the first-row sub-codeword in a next decoding iteration, and the soft decision decoding is not performed on the first-row sub-codeword in the next decoding iteration when a value indicated by the first turn-off identifier is the first value; and
storing the first hard decision result.

2. The method according to claim 1, wherein the method further comprises:
determining that a value of at least one first bit in the first hard decision result is different from a value of the first bit in a hard decision result stored before the soft decision decoding is performed on the first-row sub-codeword, wherein the first bit corresponds to a first-column sub-codeword, and the first-column sub-codeword and the first-row sub-codeword intersect at the first bit;
setting, to a second value, a turn-off identifier corresponding to the first-column sub-codeword; and
in response to determining that a value indicated by the turn-off identifier corresponding to the first-column sub-codeword is the second value, performing soft decision decoding on the first-column sub-codeword in a next decoding iteration.

3. The method according to claim 1, wherein the method further comprises:
obtaining a second turn-off identifier corresponding to a second sub-codeword in the plurality of sub-codewords, wherein a value indicated by the second turn-off identifier is the first value;
obtaining a second hard decision result of the second sub-codeword, wherein the second hard decision result is a valid hard decision result obtained in a decoding iteration before a current decoding iteration; and
determining whether to skip a decoding iteration; and
in response to determining not to skip the decoding iteration, generating second soft information based on the second hard decision result, wherein the second soft information is used for soft decision decoding in a next decoding iteration performed on the second sub-codeword; or
in response to determining to skip the decoding iteration, outputting the second hard decision result.

4. The method according to claim 3, wherein the generating second soft information based on the second hard decision result comprises:
generating the second soft information based on a symbol value corresponding to the second hard decision result and a bit width value of the second soft information.

5. The method according to claim 2, wherein the method further comprises:

obtaining a third turn-off identifier corresponding to a third sub-codeword in the plurality of sub-codewords, wherein a value indicated by the third turn-off identifier is the second value;

obtaining third soft information corresponding to the third sub-codeword;

performing soft decision decoding on the third sub-codeword based on the third soft information to obtain a third hard decision result;

determining whether the third hard decision result is valid; and in response to determining that the third hard decision result is valid:
  generating new third soft information, wherein the new third soft information is used for a subsequent decoding iteration performed on the third sub-codeword; and
  updating the value indicated by the third turn-off identifier to the first value.

6. The method according to claim 5, wherein after the performing soft decision decoding on the third sub-codeword based on the third soft information to obtain a third hard decision result, the method further comprises:
  determining that a current decoding iteration is a final decoding iteration in a preset quantity of decoding iterations;
  skipping the decoding iteration; and
  outputting the third hard decision result.

7. The method according to claim 5, wherein the determining whether the third hard decision result is valid comprises:
  calculating, based on the third hard decision result obtained for the third sub-codeword, a syndrome matrix corresponding to the third sub-codeword; and
  determining, based on a value of the syndrome matrix corresponding to the third sub-codeword, whether the third hard decision result is valid.

8. A decoder, wherein the decoder comprises:
  at least one processor;
  a first memory;
  a second memory; and
  one or more memories coupled to the at least one processor and storing programming instructions for execution by the at least one processor to:
    perform soft decision decoding on a first-row sub-codeword in a plurality of sub-codewords of a codeword to obtain a first hard decision result;
    store, by the first memory, a first turn-off identifier corresponding to the first-row sub-codeword;
    store, by the second memory, the first hard decision result;
    set the first turn-off identifier to a first value, wherein the first turn-off identifier indicates whether to perform soft decision decoding on the first-row sub-codeword in a next decoding iteration, and the soft decision decoding is not performed on the first-row sub-codeword in the next decoding iteration when a value indicated by the first turn-off identifier is the first value; and
    store the first hard decision result in the second memory.

9. The decoder according to claim 8, wherein the decoder further comprises an output interface, and wherein the programming instructions are for execution by the at least one processor to output, by the output interface, the first hard decision result obtained through decoding the first-row sub-codeword.

10. The decoder according to claim 8, wherein the programming instructions are for execution by the at least one processor to:
  determine that a value of at least one first bit in the first hard decision result is different from a value of the first bit in a hard decision result stored before the soft decision decoding is performed on the first-row sub-codeword, wherein the first bit corresponds to a first-column sub-codeword, and the first-column sub-codeword and the first-row sub-codeword intersect at the first bit;
  set, to a second value, a turn-off identifier corresponding to the first-column sub-codeword; and
  in response to determining that a value indicated by the turn-off identifier corresponding to the first-column sub-codeword is the second value, perform soft decision decoding on the first-column sub-codeword in the next decoding iteration.

11. The decoder according to claim 8, wherein the decoder further comprises an input interface and an output interface, and wherein the programming instructions are for execution by the at least one processor to:
  obtain, by the input interface, a second turn-off identifier corresponding to a second sub-codeword in the plurality of sub-codewords, wherein a value indicated by the second turn-off identifier is the first value;
  obtain, by the input interface, a second hard decision result of the second sub-codeword;
  determine whether to skip a decoding iteration; and
  in response to determining not to skip the decoding iteration, generate second soft information based on the second hard decision result, wherein the second soft information is used for soft decision decoding in the next decoding iteration performed on the second sub-codeword; or
  in response to determining to skip the decoding iteration, output, by the output interface, the second hard decision result obtained through decoding the second sub-codeword.

12. The decoder according to claim 10, wherein the decoder further comprises an input interface, and wherein the programming instructions are for execution by the at least one processor to:
  obtain, by the input interface, a third turn-off identifier corresponding to a third sub-codeword in the plurality of sub-codewords, wherein a value indicated by the third turn-off identifier is the second value;
  obtain, by the input interface, third soft information corresponding to the third sub-codeword;
  perform soft decision decoding on the third sub-codeword based on the third soft information to obtain a third hard decision result; and
  in response to determining that the third hard decision result is valid;
    generate new third soft information, wherein the new third soft information is used for a subsequent decoding iteration performed on the third sub-codeword; and
    update the value indicated by the third turn-off identifier to the first value.

13. The decoder according to claim 12, wherein the decoder further comprises an output interface, and wherein after performing the soft decision decoding on the third sub-codeword based on the third soft information to obtain the third hard decision result, the programming instructions are for execution by the at least one processor to:
  skip a decoding iteration; and output, by the output interface, the third hard decision result.

14. The decoder according to claim 11, wherein determining whether to skip the decoding iteration comprises:
   determining whether a current quantity of iterations reaches a preset quantity of iterations; and
   skipping the decoding iteration in response to determining that the current quantity of iterations reaches the preset quantity of iterations; or
   keeping the decoding iteration in response to determining that the current quantity of iterations does not reach the preset quantity of iterations.

15. A decoding apparatus, wherein the decoding apparatus comprises:
   at least one processor; and
   one or more memories coupled to the at least one processor and storing programming instructions for execution by the at least one processor to perform operations comprising:
      performing soft decision decoding on a first-row sub-codeword in a plurality of sub-codewords of a codeword to obtain a first hard decision result;
      determining whether to skip a decoding iteration; and
      in response to determining not to skip the decoding iteration:
         setting, to a first value based on the first hard decision result, a first turn-off identifier corresponding to the first-row sub-codeword, wherein the first turn-off identifier indicates whether to perform soft decision decoding on the first-row sub-codeword in a next decoding iteration, and the soft decision decoding is not performed on the first-row sub-codeword in the next decoding iteration when a value indicated by the first turn-off identifier is the first value; and
         storing the first hard decision result.

16. The decoding apparatus according to claim 15, wherein the operations further comprises:
   determining that a value of at least one first bit in the first hard decision result is different from a value of the first bit in a hard decision result stored before the soft decision decoding is performed on the first-row sub-codeword, wherein the first bit corresponds to a first-column sub-codeword, and the first-column sub-codeword and the first-row sub-codeword intersect at the first bit;
   setting, to a second value, a turn-off identifier corresponding to the first-column sub-codeword; and
   in response to determining that a value indicated by the turn-off identifier corresponding to the first-column sub-codeword is the second value, performing soft decision decoding on the first-column sub-codeword in the next decoding iteration.

17. The decoding apparatus according to claim 16, wherein the operations further comprises:
   obtaining a second turn-off identifier corresponding to a second sub-codeword in the plurality of sub-codewords, wherein a value indicated by the second turn-off identifier is the first value;
   obtaining a second hard decision result of the second sub-codeword, wherein the second hard decision result is a valid hard decision result obtained in a decoding iteration before a current decoding iteration;
   determining whether to skip a decoding iteration; and
   in response to determining not to skip the decoding iteration,
   generating second soft information based on the second hard decision result, wherein the second soft information is used for soft decision decoding in the next decoding iteration performed on the second sub-codeword; or
   in response to determining to skip the decoding iteration, outputting the second hard decision result.

18. The decoding apparatus according to claim 17, wherein the generating second soft information based on the second hard decision result comprises:
   generating the second soft information based on a symbol value corresponding to the second hard decision result and a bit width value of the second soft information.

19. The decoding apparatus according to claim 16, wherein the operations further comprises;
   obtaining a third turn-off identifier corresponding to a third sub-codeword in the plurality of sub-codewords, wherein a value indicated by the third turn-off identifier is the second value;
   obtaining third soft information corresponding to the third sub-codeword;
   performing soft decision decoding on the third sub-codeword based on the third soft information to obtain a third hard decision result;
   determining whether the third hard decision result is valid; and
   in response to determining that the third hard decision result is valid:
      generating new third soft information, wherein the new third soft information is used for a subsequent decoding iteration performed on the third sub-codeword; and
      updating the value indicated by the third turn-off identifier to the first value.

20. The decoding apparatus according to claim 15, wherein the decoding apparatus is a chip or an integrated circuit.

* * * * *

UNITED STATES PATENT AND TRADEMARK OFFICE
CERTIFICATE OF CORRECTION

PATENT NO. : 11,750,219 B2
APPLICATION NO. : 17/852218
DATED : September 5, 2023
INVENTOR(S) : Mo Li et al.

It is certified that error appears in the above-identified patent and that said Letters Patent is hereby corrected as shown below:

In the Claims

Column 24, Line 54, Claim 12, please delete "valid;", and insert therefore -- valid: --.

Signed and Sealed this
Twenty-third Day of April, 2024

Katherine Kelly Vidal
*Director of the United States Patent and Trademark Office*